United States Patent
Sato et al.

(10) Patent No.: US 10,732,741 B2
(45) Date of Patent: Aug. 4, 2020

(54) CONDUCTIVE ELEMENT, MANUFACTURING METHOD FOR SAME, INPUT DEVICE, AND ELECTRONIC APPARATUS

(71) Applicant: Sony Corporation, Tokyo (JP)

(72) Inventors: Akira Sato, Miyagi (JP); Takeshi Takahashi, Miyagi (JP); Kazuya Hashimoto, Miyagi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/759,196

(22) PCT Filed: Jul. 22, 2016

(86) PCT No.: PCT/JP2016/003420
§ 371 (c)(1),
(2) Date: Mar. 9, 2018

(87) PCT Pub. No.: WO2017/046987
PCT Pub. Date: Mar. 23, 2017

(65) Prior Publication Data
US 2018/0253164 A1    Sep. 6, 2018

(30) Foreign Application Priority Data

Sep. 18, 2015    (JP) .................. 2015-185573

(51) Int. Cl.
*G06F 3/041*    (2006.01)
*H05K 1/02*    (2006.01)
*H05K 3/12*    (2006.01)

(52) U.S. Cl.
CPC ............. *G06F 3/041* (2013.01); *H05K 1/028* (2013.01); *H05K 3/1216* (2013.01);
(Continued)

(58) Field of Classification Search
CPC ......... G06F 3/041; G06F 3/045; H05K 1/028; H05K 1/097
(Continued)

(56) References Cited

U.S. PATENT DOCUMENTS 5,657,029 A * 8/1997 Iijima .................. H01Q 1/1271
  343/713
6,103,669 A * 8/2000 Okayama .............. H01L 39/143
  257/E39.018
(Continued)

FOREIGN PATENT DOCUMENTS

JP    2010-147860 A    7/2010
JP    2012-185607 A    9/2012
(Continued)

OTHER PUBLICATIONS

International Search Report and Written Opinion and English translation thereof dated Sep. 6, 2016 in connection with International Application No. PCT/JP2016/003420.
(Continued)

*Primary Examiner* — Fred Tzeng
(74) *Attorney, Agent, or Firm* — Wolf, Greenfield & Sacks, P.C.

(57) ABSTRACT

A conductive element includes wiring having a flat portion at a top portion and including metal particles. An average value of a ratio of a width of the flat portion to a width of the wiring is 20% or more. An average value of arithmetic average roughness of the top portion is 1 μm or less.

12 Claims, 14 Drawing Sheets

(52) U.S. Cl.
CPC . *H05K 3/1283* (2013.01); *G06F 2203/04103* (2013.01); *H05K 2201/0108* (2013.01); *H05K 2201/10151* (2013.01); *H05K 2203/0143* (2013.01); *H05K 2203/0278* (2013.01); *H05K 2203/1545* (2013.01)

(58) Field of Classification Search
USPC .......................................................... 345/173
See application file for complete search history.

(56) References Cited

U.S. PATENT DOCUMENTS

| | | | | |
|---|---|---|---|---|
| 6,286,207 | B1* | 9/2001 | Oura | C23C 18/1608 |
| | | | | 205/126 |
| 7,333,346 | B2* | 2/2008 | Miyagawa | H01L 22/32 |
| | | | | 361/784 |
| 9,496,068 | B2* | 11/2016 | Kurihara | B22F 1/0022 |
| 9,946,426 | B2* | 4/2018 | Chen | G06F 3/044 |
| 2003/0157272 | A1* | 8/2003 | Tonai | H01L 21/288 |
| | | | | 427/600 |
| 2007/0098883 | A1* | 5/2007 | Itoh | C09D 5/24 |
| | | | | 427/180 |
| 2009/0136719 | A1* | 5/2009 | Kawamura | B32B 3/14 |
| | | | | 428/195.1 |
| 2009/0284475 | A1* | 11/2009 | Nashiki | G06F 3/045 |
| | | | | 345/173 |
| 2009/0295285 | A1* | 12/2009 | Tokunaga | H01L 51/5212 |
| | | | | 313/505 |
| 2011/0285019 | A1* | 11/2011 | Alden | B82Y 30/00 |
| | | | | 257/741 |
| 2013/0045362 | A1* | 2/2013 | Chang | G03F 7/027 |
| | | | | 428/141 |
| 2015/0234271 | A1* | 8/2015 | Tokunaga | G03F 7/0043 |
| | | | | 430/14 |
| 2015/0338739 | A1* | 11/2015 | Lushington | G03F 7/32 |
| | | | | 430/325 |
| 2016/0081184 | A1 | 3/2016 | Katagiri et al. | |
| 2016/0081189 | A1* | 3/2016 | Shimoda | H05K 1/097 |
| | | | | 428/209 |
| 2016/0133357 | A1* | 5/2016 | Cok | C09D 11/52 |
| | | | | 427/108 |

FOREIGN PATENT DOCUMENTS

| | | |
|---|---|---|
| JP | 2013-164990 A | 8/2013 |
| JP | 2014-026584 A | 2/2014 |
| JP | 2015-005495 A | 1/2015 |
| JP | 2015-156260 A | 8/2015 |

OTHER PUBLICATIONS

International Preliminary Report on Patentability and English translation thereof dated Mar. 29, 2018 in connection with International Application No. PCT/JP2016/003420.

* cited by examiner

FIG. 5
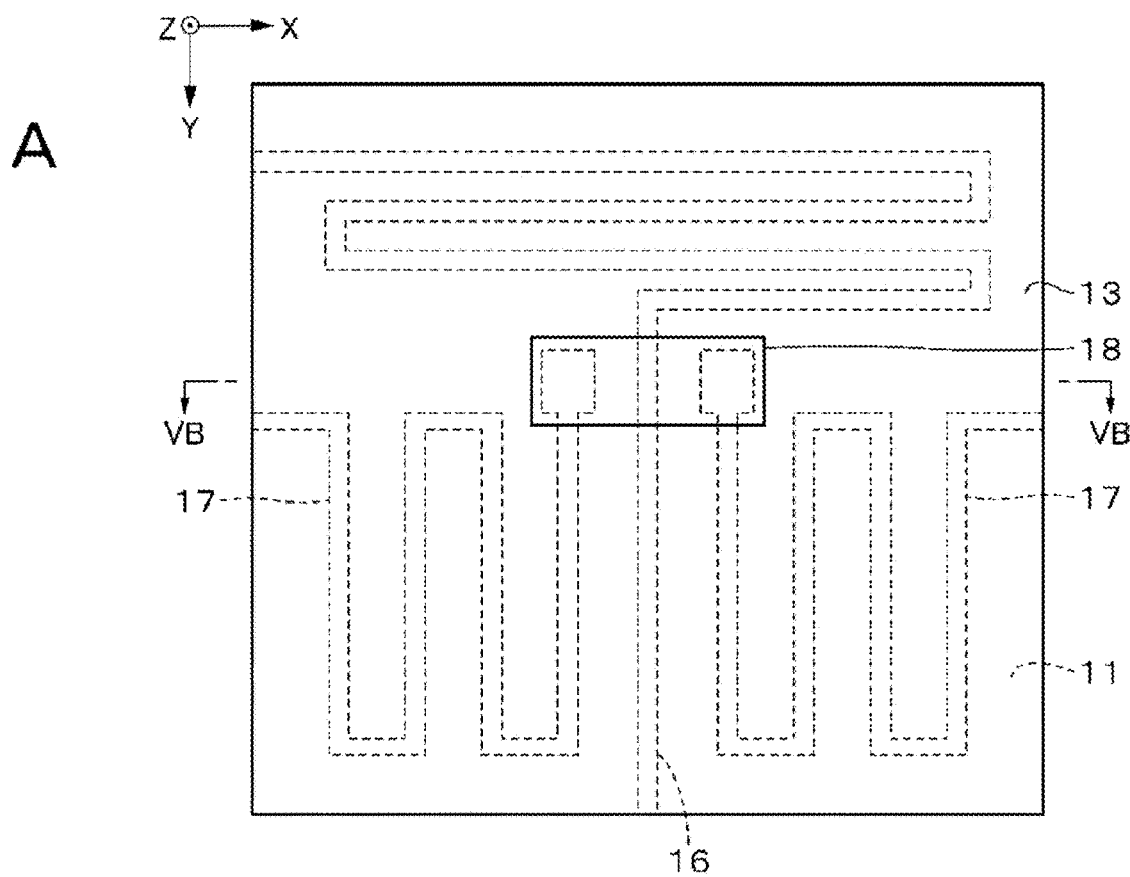
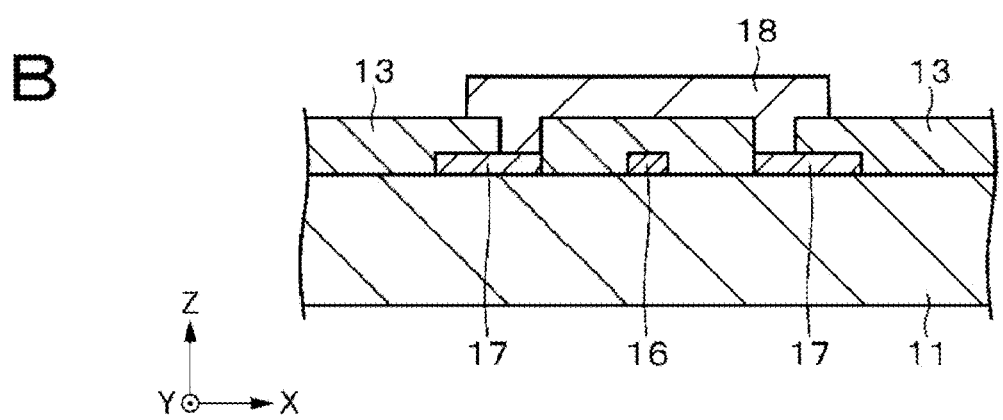

FIG. 7
A
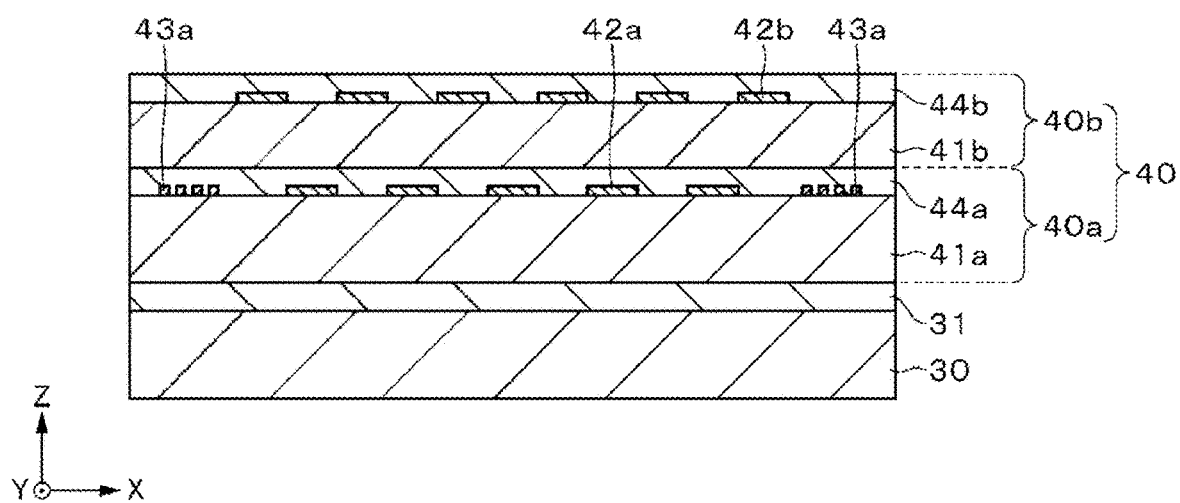
B
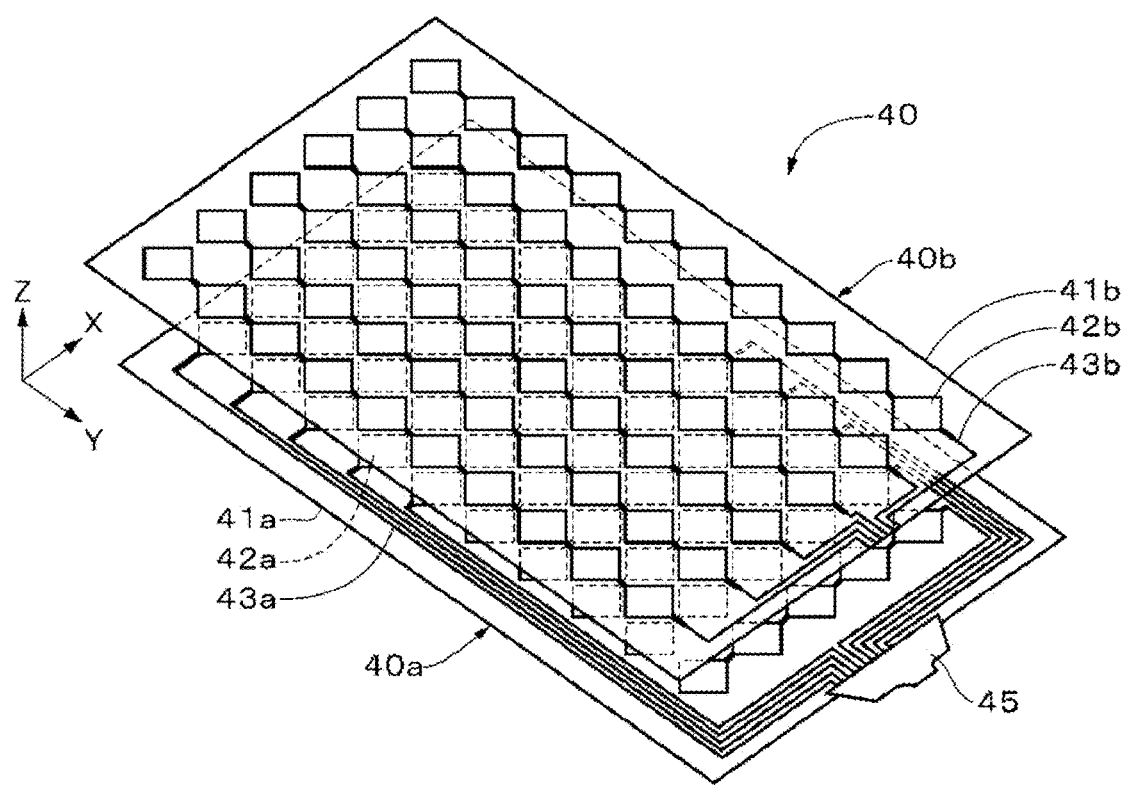

FIG. 8
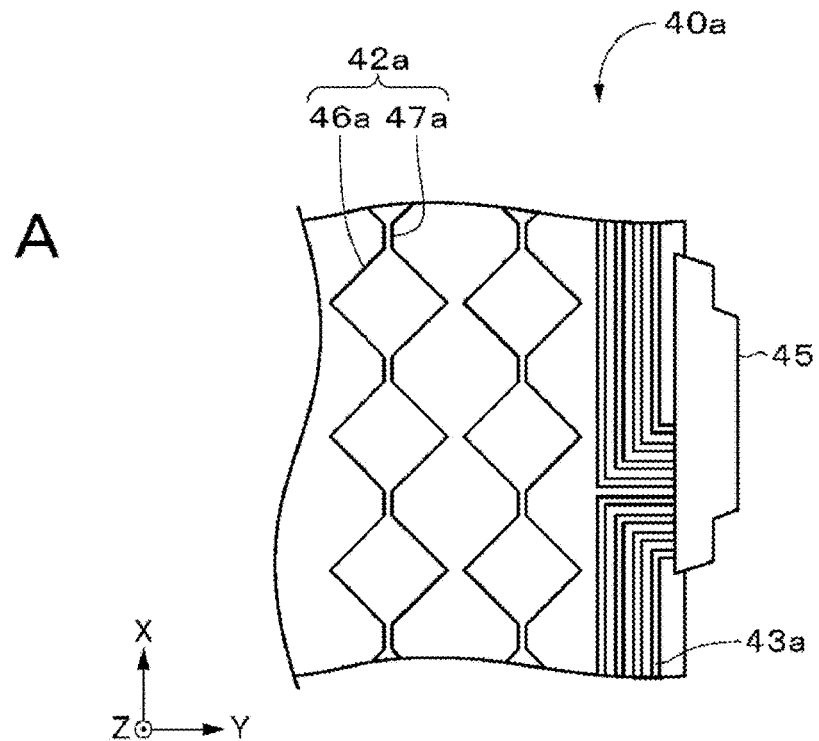
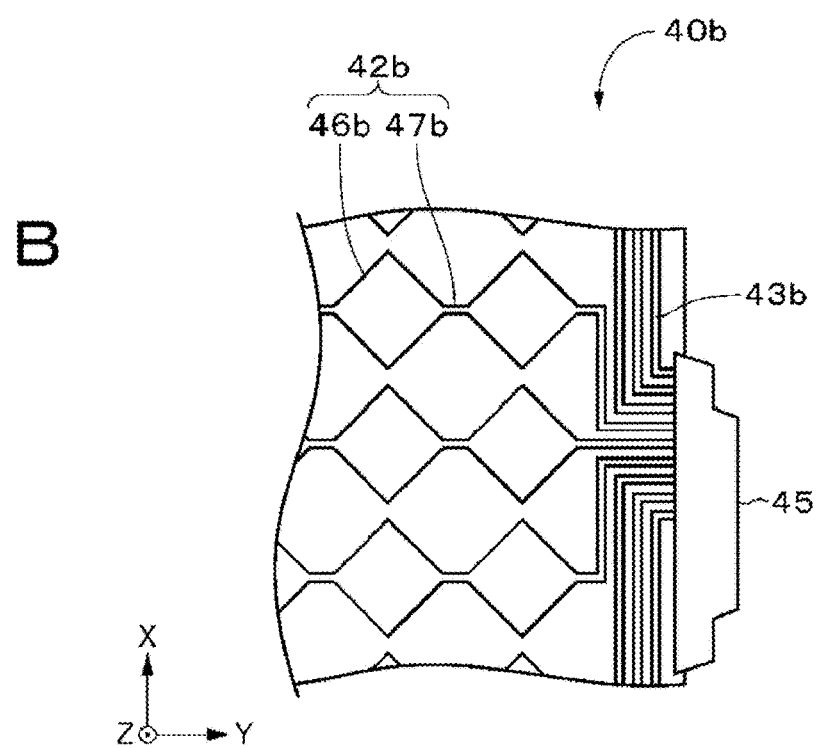

FIG. 9
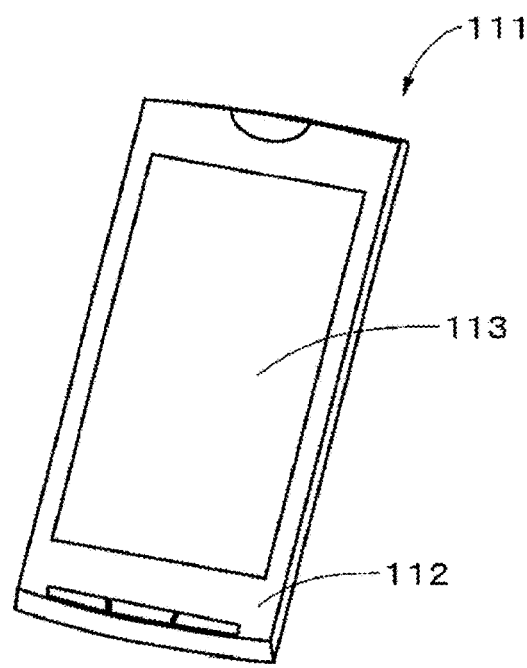
A
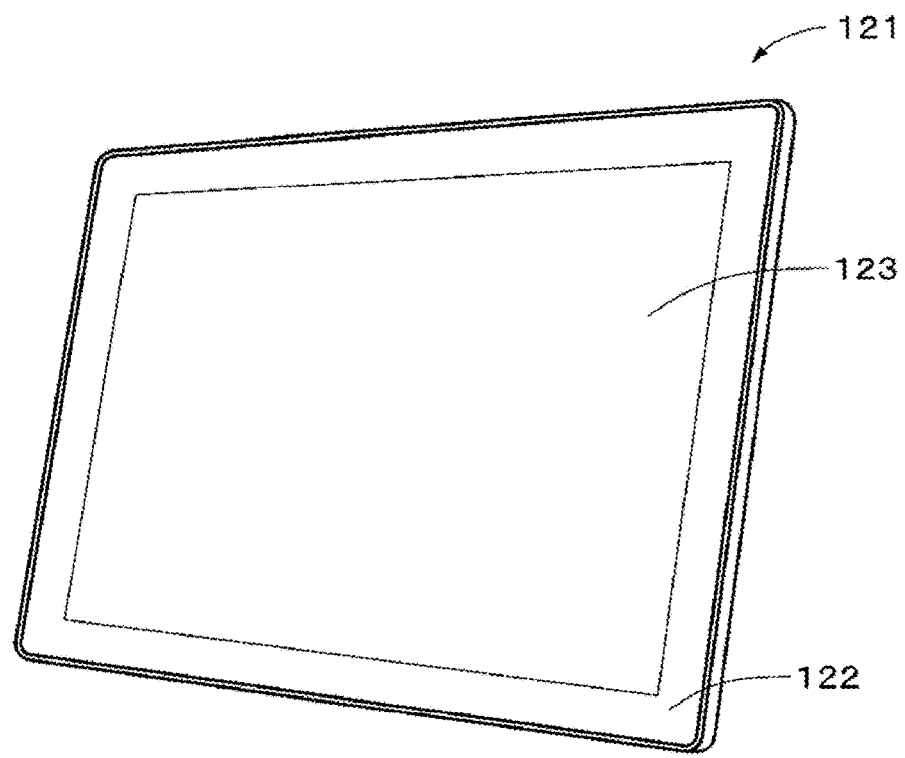
B

FIG. 13
A
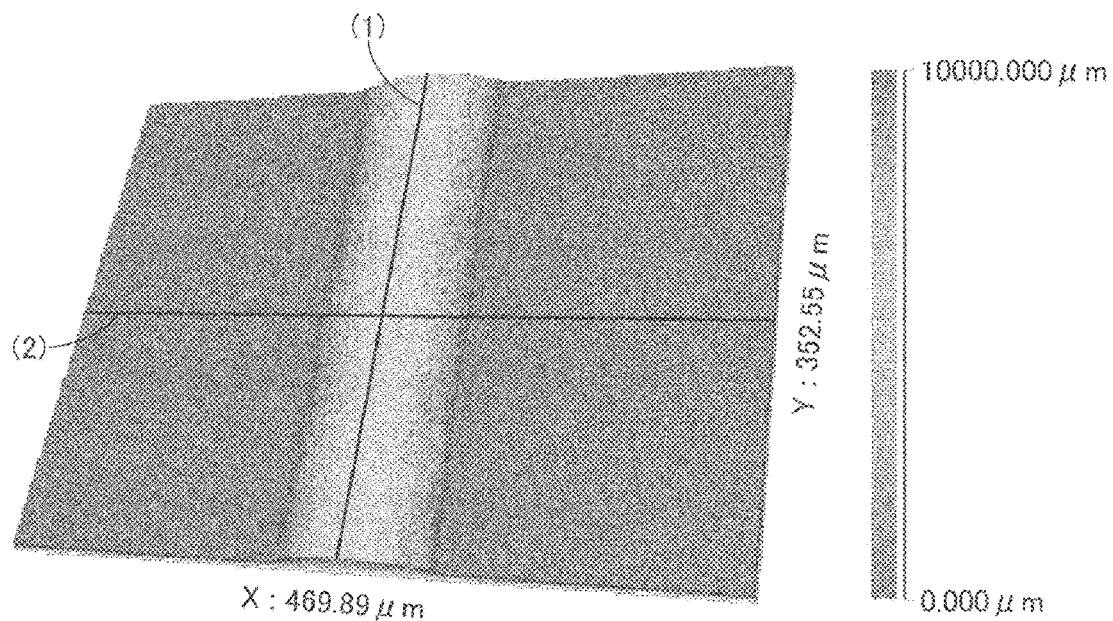
B
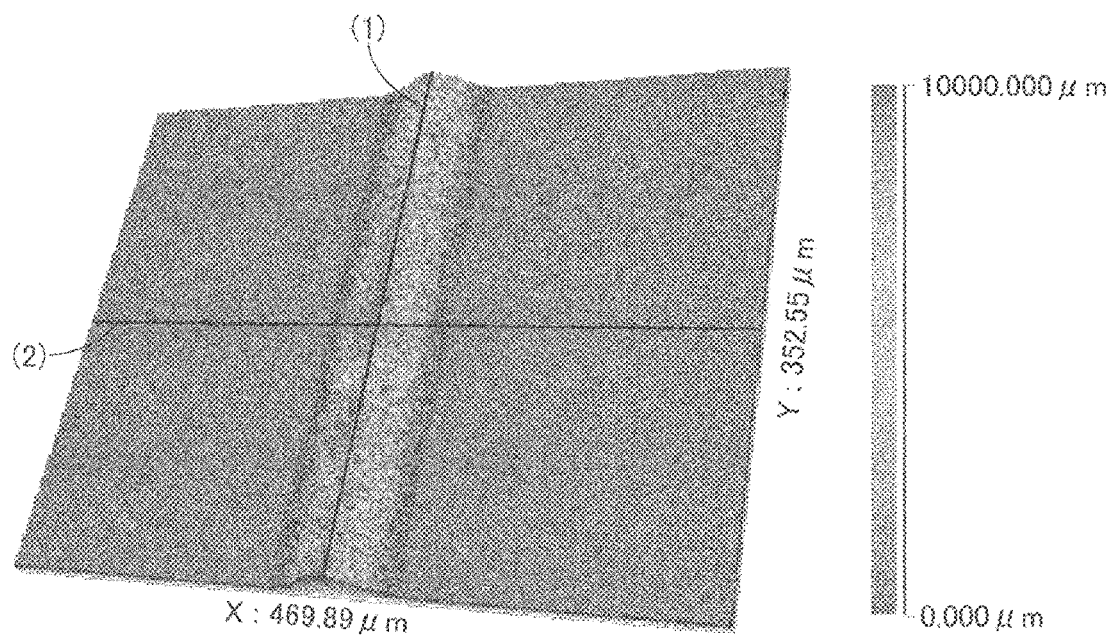

FIG. 14
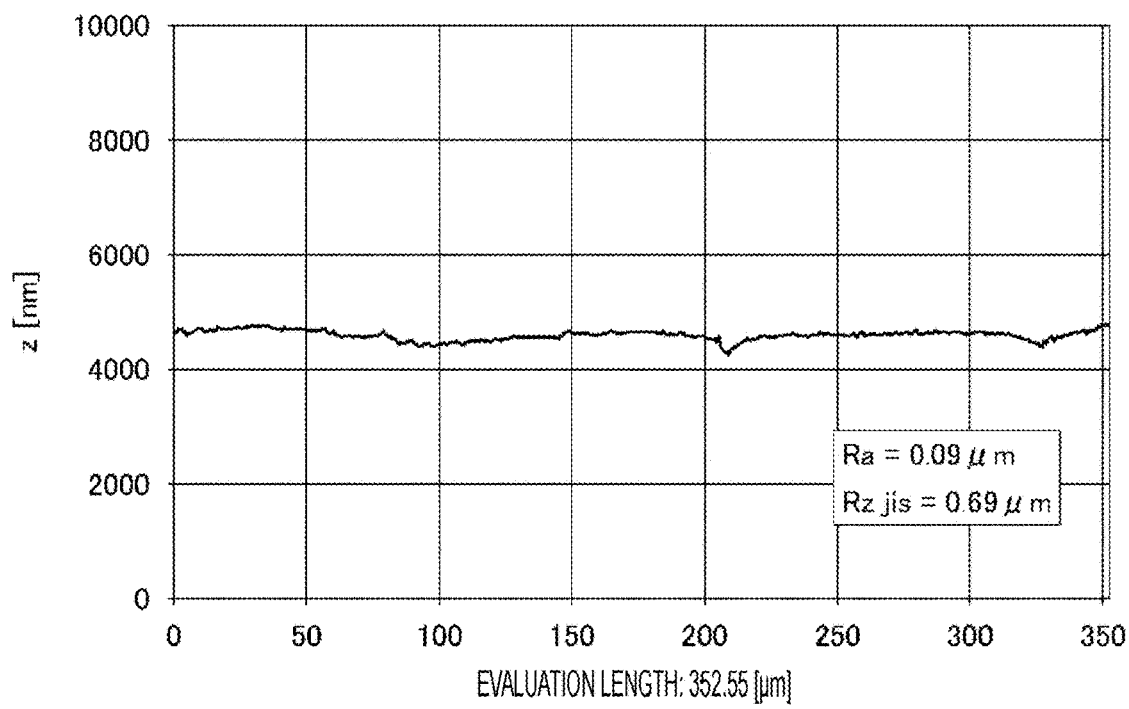
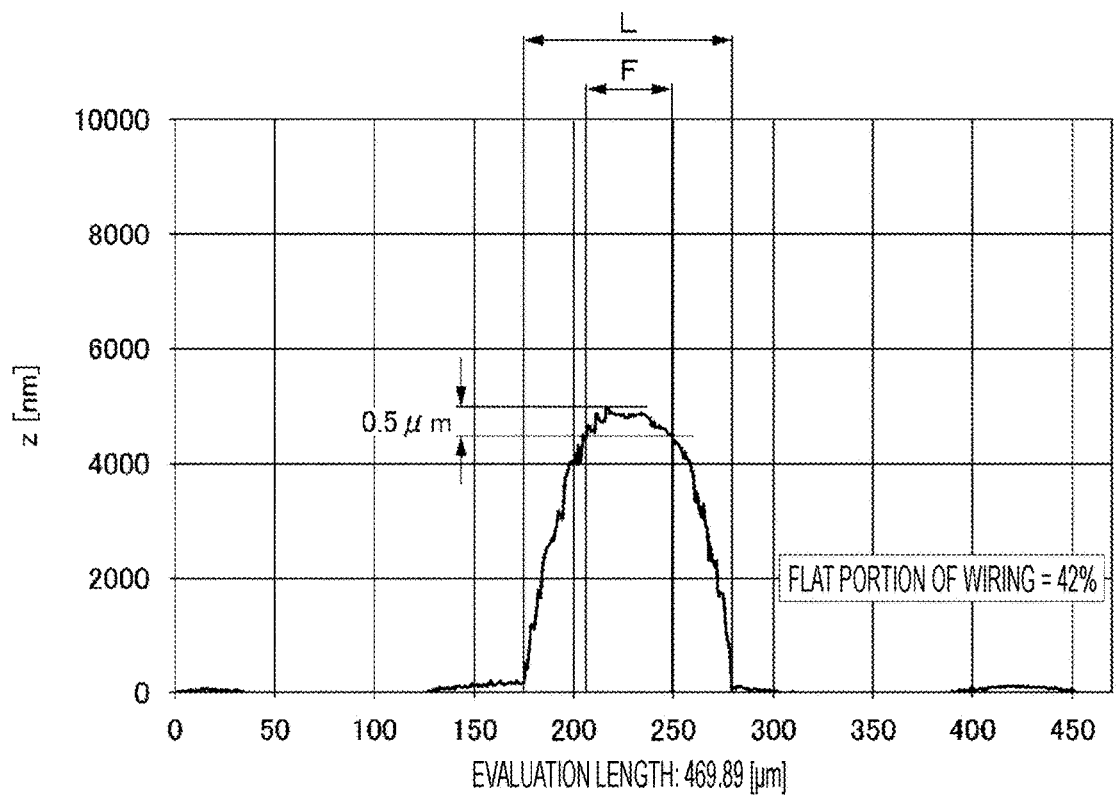

FIG. 15
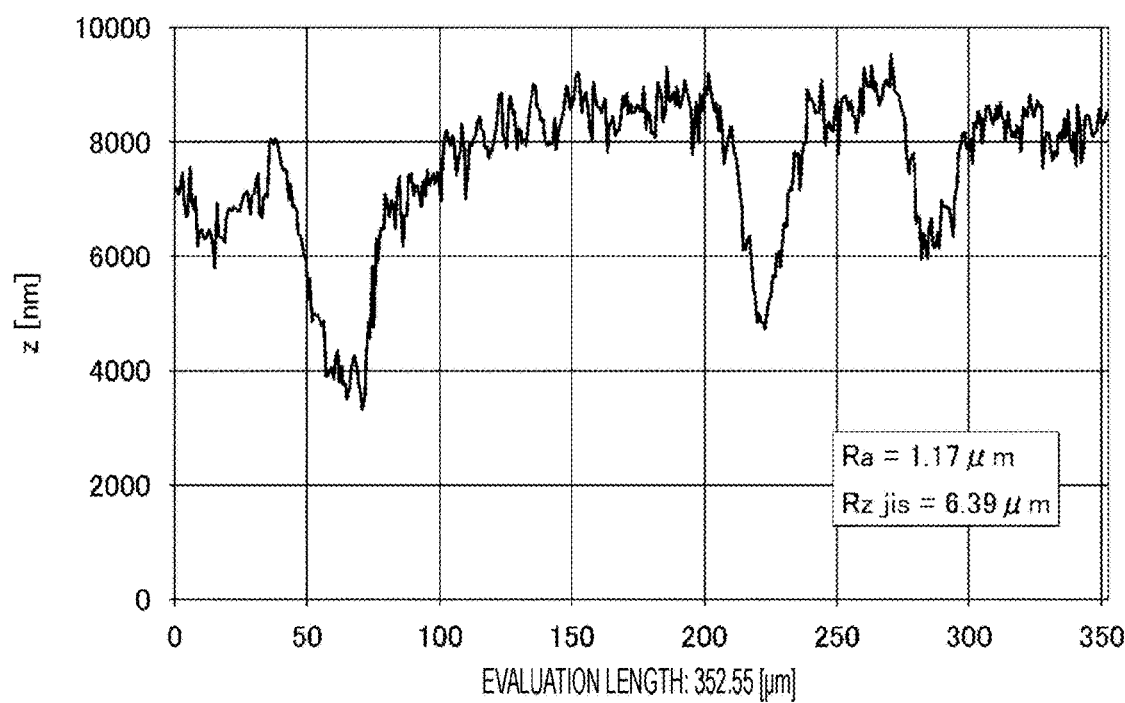
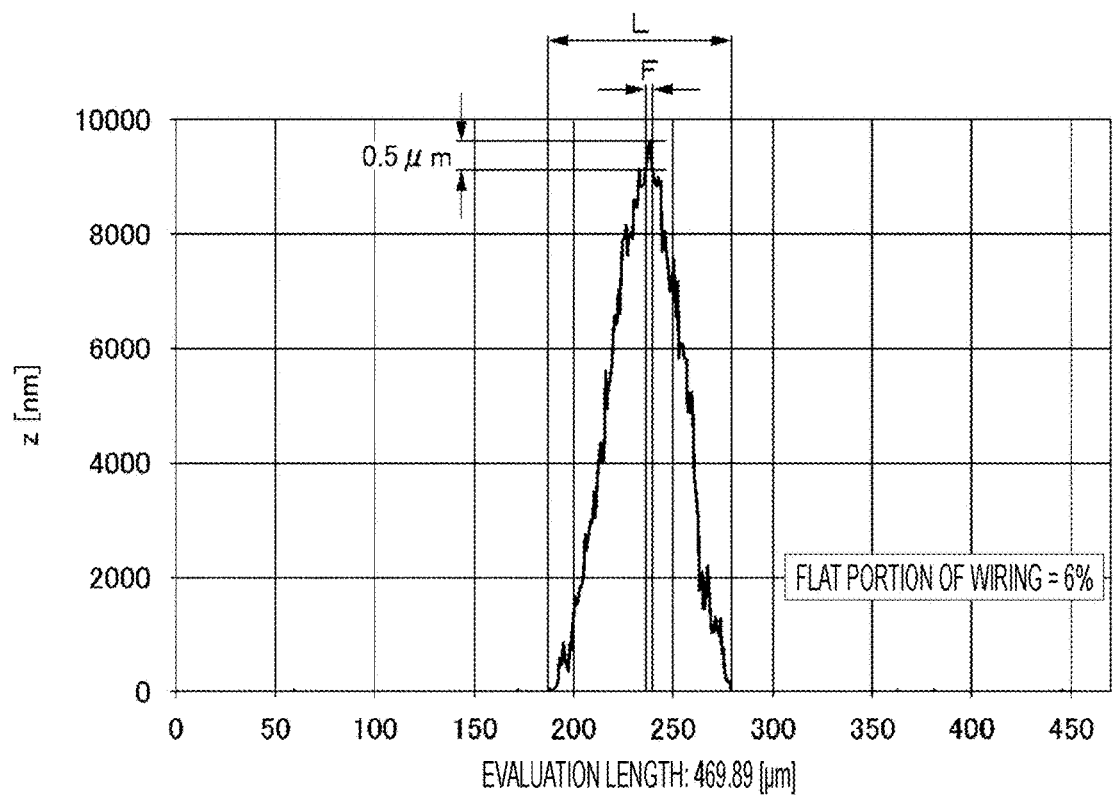

CONDUCTIVE ELEMENT, MANUFACTURING METHOD FOR SAME, INPUT DEVICE, AND ELECTRONIC APPARATUS

CROSS-REFERENCE TO RELATED APPLICATIONS

This application is a U.S. National Stage Entry under 35 U.S.C. § 371 of International Application No. PCT/JP2016/003420, filed in the Japanese Patent Office on Jul. 22, 2016, which claims priority to Japanese Patent Application No. JP2015-185573, filed in the Japanese Patent Office on Sep. 18, 2015, each of which is incorporated by reference herein in its entirety.

TECHNICAL FIELD

The present technology relates to a conductive element, a manufacturing method for the same, an input device, and an electronic apparatus.

BACKGROUND ART

In recent years, a technology of forming wiring with metal particles is actively studied. For example, Patent Document 1 discloses a technology of forming routed wiring to connect a transparent electrode to an external circuit on a touch panel by performing drying treatment or annealing treatment after printing a conductive paste.

CITATION LIST

Patent Document

Patent Document 1: Japanese Patent Application Laid-Open No. 2014-26584 (paragraph [0037])

SUMMARY OF THE INVENTION

Problems to be Solved by the Invention

Wiring formed with metal particles tends to have large irregularities on a surface thereof. Generally various kinds of layers, parts, and the like are formed on the wiring, but in a case of having large irregularities on the wiring surface, it may be difficult to form these layers, parts, and the like on the wiring.

The present technology is directed to providing a conductive element, a manufacturing method for the same, an input device, and an electronic apparatus, in which irregularities on a wiring surface is reduced.

Solutions to Problems

To solve the above-described problem, a first technology is a conductive element including wiring having a flat portion at a top portion and including metal particles, and an average value of a ratio of a width of the flat portion to a width of the wiring is 20% or more, and an average value of arithmetic average roughness at the top portion is 1 µm or less.

A second technology is a conductive element including an antenna having a flat portion at a top portion and including metal particles, in which an average value of a ratio of a width of the flat portion to a width of the antenna is 20% or more, and an average value of arithmetic average roughness at the top portion is, 1 µm or less.

A third technology is a manufacturing method for a conductive element, including: printing a conductive paste or conductive ink including metal particles; and pressurizing and simultaneously annealing the printed conductive paste or the printed conductive ink to form wiring having a flat portion at a top portion, in which an average value of a ratio of a width of the flat portion to a width of the wiring is 20% or more, and an average value of arithmetic average roughness of the top portion is 1 µm or less.

A fourth technology is an input device including the conductive element according to the first or second technology.

A fifth technology is an electronic apparatus including the conductive element according to the first or second technology.

Effects of the Invention

As described above, according to the present technology, a conductive element in which irregularities on a wiring surface can be reduced.

BRIEF DESCRIPTION OF DRAWINGS

FIG. 5A is a plan view illustrating an exemplary configuration of a conductive element according to a third embodiment of the present technology. FIG. 5B is a cross-sectional view taken along a line VB-VB in FIG. 5A.

FIG. 7A is a cross-sectional view illustrating an exemplary configuration of an input device according to a fourth embodiment of the present technology. FIG. 7B is an exploded perspective view illustrating an exemplary configuration of the input device according to the fourth embodiment of the present technology.

FIG. 8A is a plan view illustrating an exemplary configuration of a first transparent conductive element. FIG. 8B is a plan view illustrating an exemplary configuration of a second transparent conductive element.

FIG. 9A is a perspective view illustrating a first example of an electronic apparatus according to a fifth embodiment of the present technology. FIG. 9B is a perspective view illustrating a second example of the electronic apparatus according to the fifth embodiment of the present technology.

FIG. 13A is a view illustrating an observation result of wiring in Working Example 1. FIG. 13B is a view illustrating an observation result of wiring in Comparative Example 1.

FIG. 14A is a diagram illustrating a cross-sectional profile taken along a line (1) in FIG. 13A. FIG. 14B is a view illustrating a cross-sectional profile taken along a line (2) in FIG. 13A.

FIG. 15A is a diagram illustrating a cross-sectional profile taken along a line (1) in FIG. 13B. FIG. 15B is a diagram illustrating a cross-sectional profile taken along a line (2) of FIG. 13B.

MODE FOR CARRYING OUT THE INVENTION

Embodiments of the present technology will be described in the following order. Note that a same or correspondent portion will be denoted by a same reference sign in all of the drawings of the following embodiments.
1 First Embodiment (Exemplary Conductive Element)
2 Second Embodiment (Exemplary Conductive Element)
3 Third Embodiment (Exemplary Conductive Element)
4 Fourth Embodiment (Exemplary Input Device)
5 Fifth Embodiment (Exemplary Electronic Apparatus)
6 Sixth Embodiment (Exemplary Conductive Element)

1. First Embodiment

[Configuration of Conductive Element]

Figure 1:
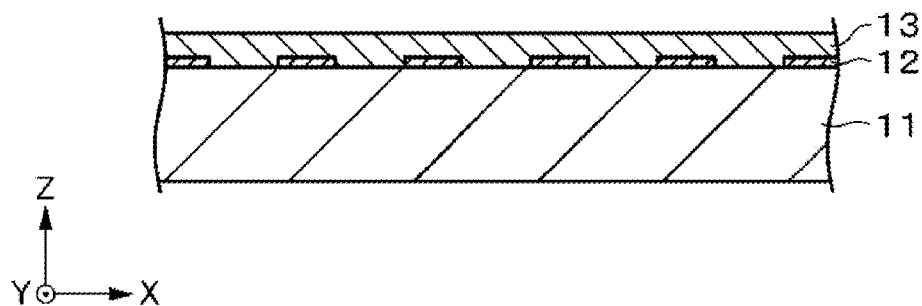
FIG. 1 is a cross-sectional view illustrating an exemplary configuration of a conductive element according to a first embodiment of the present technology.

As illustrated in FIG. 1, a conductive element according to a first embodiment of the present technology includes a base material 11, wiring 12 provided on one surface of the base material 11, and an insulation layer 13 provided on the one surface of the base material 11 in a manner covering the wiring 12.

The conductive element can be used for various kinds of conductive elements including the wiring 12. Specific examples of the conductive element include input elements such as a capacitive touch panel and a resistive touch panel, an IC card, display elements such as a liquid crystal display element, an organic electro-luminescence (hereinafter referred to as "EL") element, an inorganic EL element, and an electronic paper, a printed wiring board, a printed circuit board, and the like. Here, the "printed wiring board" represents a component not provided with an electronic part and including only the wiring 12. Additionally, the "printed circuit board" represents a component provided with an electronic part together with the wiring 12 so as to operate as an electronic circuit. Meanwhile, in the printed wiring board and the printed circuit board, a kind of a substrate is not particularly limited, and any one of a flexible substrate, a rigid substrate, and a rigid flexible substrate may be used.

(Base Material)

The base material 11 is a base material having flexibility or rigidity, and the base material having flexibility is preferable as the base material 11 from the viewpoint of manufacturing a conductive element by a roll-to-roll method. As a shape of the base material 11, for example, a film-like shape, a sheet-like shape, a substrate-like shape, or the like can be used. As a material of the base material 11, for example, any one of an inorganic material and an organic material can be used. As an inorganic material, quartz, sapphire, glass, a clay film, and the like can be exemplified. As an organic material, for example, a known polymer material can be used. Specific examples of the known polymer material can include triacetyl cellulose (TAC), polyester (TPEE), polyethylene terephthalate (PET), polyethylene naphthalate (PEN), polyimide (PI), polyamide (PA), aramid, polyethylene (PE), polyacrylate, polyether sulfone, polysulfone, polypropylene (PP), diacetyl cellulose, polyvinyl chloride, an acrylic resin (PMMA), polycarbonate (PC), an epoxy resin, urea resin, a urethane resin, a melamine resin, a cycloolefin polymer (COP), a cycloolefin copolymer (COC), and the like. A plastic base material preferably has a thickness of 3 to 500 µm from the viewpoint of productivity, but is not particularly limited to this range.

(Wiring)

The wiring 12 has a flat portion at a top portion and includes metal particle powder. The wiring 12 may also include, as necessary, at least one of a binder such as a thermoplastic resin, and an additive. An average value of a ratio $R_F$ (=(F/L)×100 (refer to FIG. 14B) of a width F of the flat portion included in the top portion of the wiring 12 to a width L of the wiring 12 is 20% or more, preferably 30% or more, more preferably 40% or more. In a case where the average value of the ratio $R_F$ is less than 20%, it is difficult to reduce surface irregularities of the wiring 12, and the surface irregularities of the wiring 12 may not be able to be suppressed from protruding from the insulation layer 13 unless otherwise a thickness of the insulation layer 13 is increased.

An average value of arithmetic average roughness Ra at the top portion of the wiring 12 is 1 µm or less, preferably 0.6 µm, more preferably 0.2 µm or less. In a case where the average value of the arithmetic average rough Ra exceeds 1 µm, it is difficult to reduce the surface irregularities of the wiring 12, and the surface irregularities of the wiring 12 may not be able to be suppressed from protruding from the insulation layer 13 unless otherwise the thickness of the insulation layer 13 is increased. The width of the wiring 12 is, for example, 1 µm or more and 500 µm or less.

An average value of ten-point average roughness Rz at the top portion of the wiring 12 is preferably 5 µm or less, more preferably 4 µm or less, further more preferably 2 µm or less. In a case where the average value of the ten-point average roughness Rz is 5 µm or less, the surface irregularities having large height differences is reduced, and therefore, the surface irregularities of the wiring 12 can be suppressed from protruding from the insulation layer 13 even without increasing the thickness of the insulation layer 13. The wiring 12 preferably has resistance of 10 Ω/mm or less, more preferably 5 Ω/mm or less, further more preferably 1 Ω/mm or less. Since the wiring 12 has low resistance, application to various kinds of conductive elements is possible.

The metal particles include, for example, at least one of gold (Au), silver (Ag), copper (Cu), titanium (Ti), tungsten (W), molybdenum (Mo), indium (In), aluminum (Al), and nickel (Ni).

(Insulation Layer)

The insulation layer 13 has the thickness of preferably $(H_{ave}+Rz_{ave})$ µm or more, more preferably $(H_{ave}+Rz_{ave}+10)$ µm or more. However, $H_{ave}$ represents an average value of a maximum height $H_{max}$ of the wiring 12. $Rz_{ave}$ represents an average value of the ten-point average roughness Rz at the top portion of the wiring 12. In a case where the thickness of the insulation layer 13 is $(H_{ave}+Rz_{ave})$ µm or more, the surface irregularities of the wiring 12 can be suppressed from protruding from the insulation layer 13. An upper limit value of the thickness of the insulation layer 13 is not particularly limited, but from the viewpoint of suppressing increase of the thickness of the insulation layer 13, the upper limit is preferably ($H_{ave}$+$Rz_{ave}$+30) μm or less, more preferably ($H_{ave}$+$Rz_{ave}$+20) μm or less. However, the insulation layer 13 can be set in accordance with a characteristic required for a conductive element or the like, and the insulation layer 13 may be formed thick depending on the requirement.

As a material of the insulation layer, any one of an inorganic material and an organic material may be used. As the inorganic material, for example, $SiO_2$, SiNx, SiON, $Al_2O_3$, $Ta_2O_5$, $Y_2O_3$, $HfO_2$, HfAlO, $ZrO_2$, $TiO_2$, and the like can be used. As the organic material, for example, polyacrylate like polymethyl methacrylate (PMMA), polyvinyl alcohol (PVA), polystyrene (PS), transparent polyimide, polyester, epoxy, polyvinyl phenol, polyvinyl alcohol, and the like can be used.

[Manufacturing Method for Conductive Element]

Figure 2:
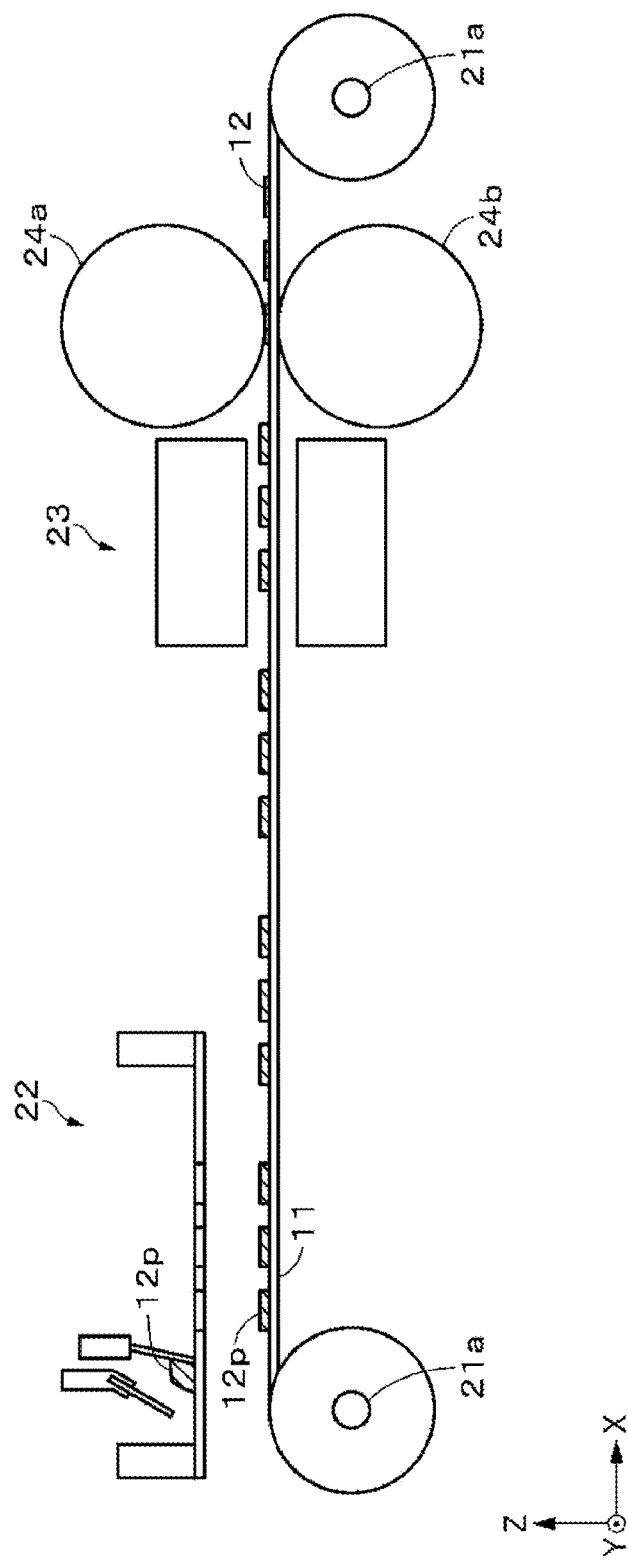
FIG. 2 is a schematic view to describe an exemplary manufacturing method for a conductive element according to the first embodiment of the present technology.

Next, an exemplary manufacturing method for a conductive element according to the first embodiment of the present technology will be described with reference to FIG. 2.

(Printing)

First, a printing machine 22 prints a conductive paste 12p on one surface of the base material 11 that has been rolled out from a roller 21a. The conductive paste 12p includes the above-described metal particle powder and solvent. The conductive paste may include, as necessary, at least one of a binder such as a thermoplastic resin, and an additive. Note that conductive ink may also be used instead of the conductive paste.

As the printing machine 22, for example, a screen printing machine, a gravure printing machine, a waterless flat plate printing machine, a flexo printing machine, a gravure offset printing machine, a reverse offset printing machine, or the like can be used. Note that an example of using a screen printing machine as the printing machine 22 is illustrated in FIG. 2. An average print thickness of the conductive paste 12p is, for example, 3 μm or more and 12 μm or less. In a case of using a gravure printing machine as the printing machine 22, the average print thickness of the conductive paste 12p is, for example, 3 μm or more and 4 μm or less. In a case of using the screen printing machine as the printing machine 22, the average print thickness of the conductive paste 12p is, for example, 7 μm or more and 12 μm or less.

(Drying)

Next, the base material 11 is conveyed to a heating furnace 23 and made to pass through the heating furnace 23, thereby volatilizing the solvent included in the printed conductive paste 12p and drying the conductive paste 12p. As the heating furnace 23, for example, an infrared heating furnace, a heater heating furnace, a hot air circulation heating furnace, or the like can be used. A pulse light irradiation device may also be used instead of the heating furnace 23.

(Pressure Annealing)

Next, the base material 11 is sandwiched between rotating heating rollers 24a and 24b, and calendering treatment is applied to the dried conductive paste 12p, thereby pressurizing and simultaneously annealing the dried conductive paste 12p. With this processing, the metal particles included in the conductive paste 12p contact each other, and the wiring 12 having conductivity can be achieved. Furthermore, a time required for annealing can be shortened by thus performing pressure annealing for the conductive paste 12p. An intended conductive element can be achieved by the above-described processing.

A roller to pressurize a printing surface side of the base material 11 (hereinafter appropriately referred to as "printing surface side roller") 24a and a roller to support a back surface side of the base material 11 (hereinafter referred to as "supporting surface side roller") 24b are, for example, resin rollers or steel rollers. The printing surface side roller 24a and the supporting surface side roller 24b may have different surface temperatures. In this case, preferably, the surface temperature of the printing surface side roller 24a is higher than the surface temperature of the supporting surface side roller 24b.

The surface temperature of the printing surface side roller 24a is preferably 80° C. or more and 180° C. or less, more preferably 100° C. or more and 150° C. or less, further more preferably 100° C. or more and 130° C. or less. In a case of 80° C. or more, the wiring 12 having sufficient conductivity can be achieved. On the other hand, in a case of 180° C. or less, a polymer resin such as polyethylene terephthalate can be used as the material of the base material 11.

The surface temperature of the supporting surface side roller 24b is preferably equal to or less than the surface temperature of the printing surface side roller 24a.

A pressure applied to the printing surface of the base material 11 by nip of the rollers 24a and 24b is preferably 100 kg/cm or more and 350 kg/cm or less, more preferably 120 kg/cm or more and 300 kg/cm or less, and 200 kg/cm or more and 300 kg/cm or less. In a case of 100 kg/cm or more, the wiring 12 having sufficient conductivity can be achieved. On the other hand, it is difficult set a pressure of 350 kg/cm due to capacity of a pressurization device.

[Effects]

In the conductive element according to the first embodiment, the average value of the ratio $R_F$ of the width F of the flat portion included in the top portion of the wiring 12 to the width L of the wiring 12 is 20% or more, and the average value of arithmetic average roughness Ra at the top portion of the wiring 12 is 1 μm or less. With this structure, the surface irregularities of the wiring 12 can be reduced. Therefore, the surface irregularities of the wiring 12 can be suppressed from protruding from the insulation layer 13 without increasing the thickness of the insulation layer 13. In other words, an excellent insulation property can be achieved without increasing the thickness of the insulation layer 13.

In the manufacturing method for a conductive element according to the first embodiment, the wiring 12 is formed by performing pressure annealing for the conductive paste 12p, and therefore, the time required for annealing can be more shortened than in a general manufacturing method for a conductive element. Here, the "general manufacturing method for a conductive element" represents a manufacturing method for a conductive element in which wiring is formed by drying and annealing a conductive paste by using only a heating furnace without using a heating roller.

Additionally, in the manufacturing method for a conductive element according to the first embodiment, only drying for the conductive paste 12p, more specifically, volatilizing the solvent included in the conductive paste 12p is performed in the heating furnace 23, and therefore, a length of the heating furnace 23 can be more shortened than in the general manufacturing method for a conductive element. Meanwhile, in the general manufacturing method for a conductive element, a long heating furnace is necessary because both of drying and annealing are needed to be performed.

Modified Example

In the first embodiment, the wiring 12 including a conductive layer having a single layer structure has been described as an example, but wiring 12 including a conductive layer having a multi-layer structure may also be adopted. In this case, each of the conductive layers can be formed in a manner similar to the forming method for the wiring 12 in the first embodiment.

In the first embodiment, the configuration in which the insulation layer 13 is provided on the wiring 12 has been described as an example, but a configuration of providing, on the wiring 12, a conductive layer like an electrode layer, a semiconductor layer (active layer), or the like may also be adopted, or a configuration of directly providing an electronic part on the wiring 12 may also be adopted. In a case of adopting this configuration, an average value of the ratio $R_F (=(F/L) \times 100$ (refer to FIG. 14B)) of the width F of the flat portion included in the top portion of the wiring 12 to the width L of the wiring 12, and an average value of the arithmetic average roughness Ra at the top portion of the wiring 12 are in ranges similar to those of the first embodiment. Meanwhile, in a case where the average value of the ratio $R_F$ is less than 20%, it may be difficult to reduce the surface irregularities of the wiring 12, and various kinds of layers, parts, and the like may be hardly formed on the wiring 12. Additionally, in a case where the average value of the arithmetic average rough Ra exceeds 1 µm, it may be difficult to reduce the surface irregularities of the wiring 12, and various kinds of layers, parts, and the like may be hardly formed on the wiring 12. Furthermore, preferably, the average value of the ten-point average roughness Rz at the top portion of the wiring 12 is similar to that of the first embodiment. Meanwhile, in a case where the average value of the ten-point average roughness Rz is 5 µm or less, the surface irregularities having large height differences is reduced, and therefore, various kinds of layers, parts, and the like are easily formed on the wiring 12.

2. Second Embodiment

[Configuration of Conductive Element]

Figure 3:
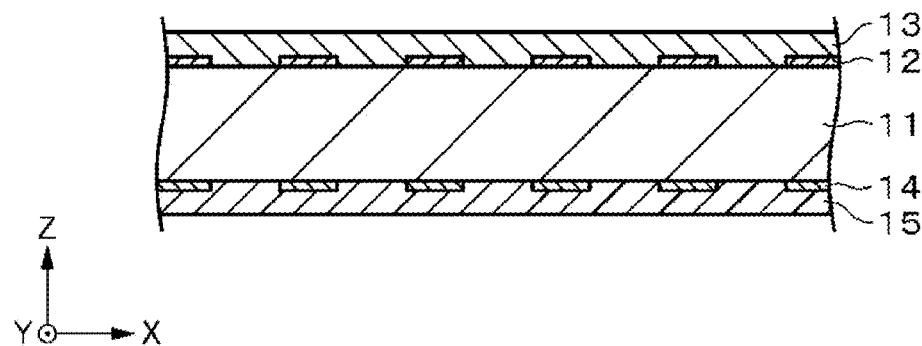
FIG. 3 is a cross-sectional view illustrating an exemplary configuration of a conductive element according to a second embodiment of the present technology.

As illustrated in FIG. 3, a conductive element according to a second embodiment of the present technology differs from a conductive element according to a first embodiment in including: wiring 14 provided on the other surface of a base material 11; and an insulation layer 15 provided on the other surface of the base material 11 in a manner covering the wiring 14. The wiring 14 and the insulation layer 15 are similar to wiring 12 and an insulation layer 13 of the first embodiment, respectively.

[Manufacturing Method for Conductive Element]

Figure 4:
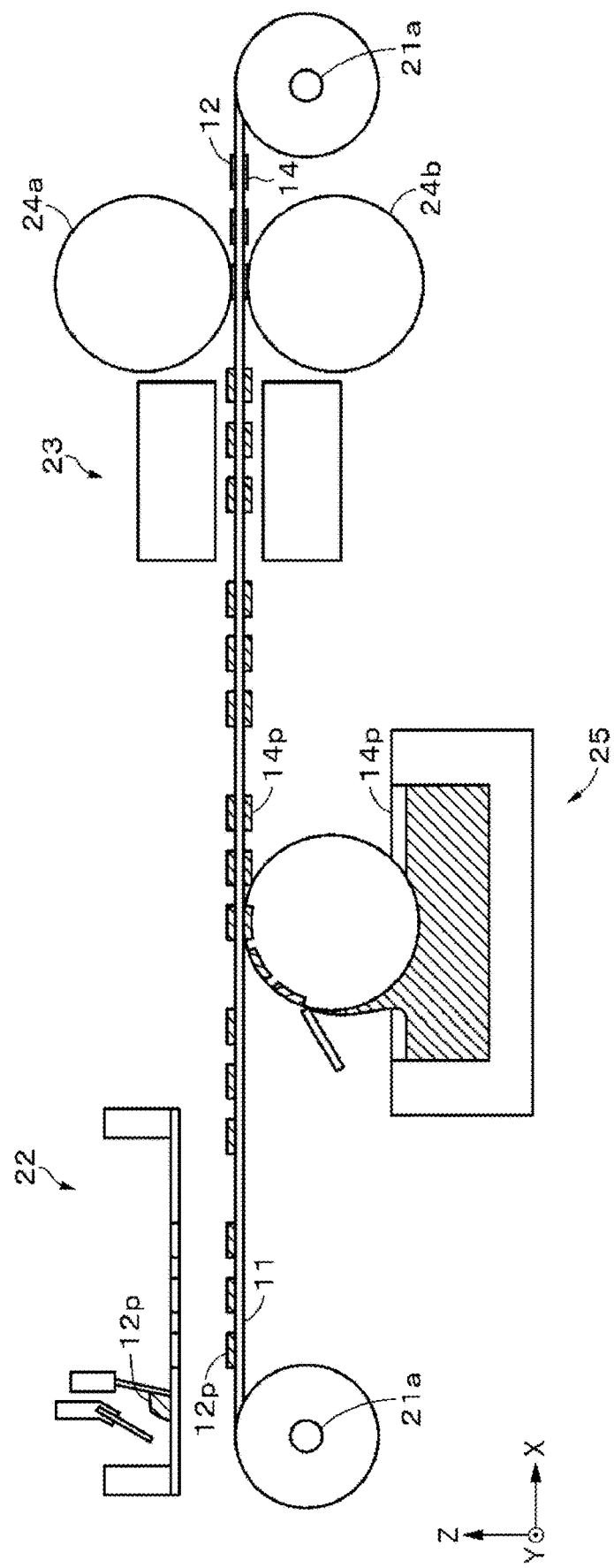
FIG. 4 is a schematic view to describe an exemplary manufacturing method for a conductive element according to the second embodiment of the present technology.

Next, an exemplary manufacturing method for a conductive element according to the second embodiment of the present technology will be described with reference to FIG. 4.

(Printing)

First, similar to the first embodiment, a printing machine 22 prints a conductive paste 12p on one surface of the base material 11 that has been rolled out from a roller 21a. Next, a printing machine 25 prints a conductive paste 14p on the other surface of the base material 11. As the printing machine 25, for example, the one similar to the printing machine 22 can be exemplified. Note that an example of using a graia printing machine as the printing machine 25 is illustrated in FIG. 4. The conductive paste 14p is similar to the conductive paste 12p.

(Drying)

Next, the base material 11 is conveyed to a heating furnace 23 and made to pass through the heating furnace 23, thereby dying the conductive pastes 12p and 14p printed on both sides of the base material 11.

(Pressure Annealing)

Next, the base material 11 is sandwiched between rotating heating rollers 24a and 24b, and calendering treatment is applied to the dried conductive pastes 12p and 14p. With this processing, the wiring 12 and wiring 14 having conductivity can be achieved. An intended conductive element can be achieved by the above-described processing.

3. Third Embodiment

[Configuration of Conductive Element]

As illustrated in FIGS. 5A and 5B, a conductive element according to a third embodiment of the present technology includes a base material 11, wiring 16, wiring 17, and jumper wiring 18 provided on one surface of the base material 11, and an insulation layer 13 provided on the one surface of the base material 11 in a manner covering the wiring 16 and wiring 17. End portions of a set of wiring 17, 17 are provided apart from each other at a predetermined interval, and the wiring 16 is provided in a manner passing between the end portions. The end portions of the set of wiring 17, 17 are electrically connected by the jumper wiring 18, and the jumper wiring 18 and the wiring 16 are insulated from each other by the insulation layer 13. The wiring 16 and wiring 17 are similar to wiring 12 in a first embodiment in other points.

[Manufacturing Method for Conductive Element]

Next, an exemplary manufacturing method for a conductive element according to the third embodiment of the present technology will be described with reference to FIGS. 6A to 6D.

Figure 6A:
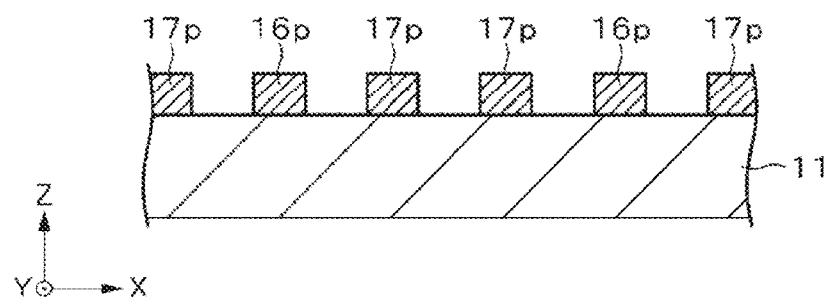
FIGS. 6A, 6B, 6C, and 6D are process diagrams to describe an exemplary manufacturing method for a conductive element according to the third embodiment of the present technology.
Figure 6B:
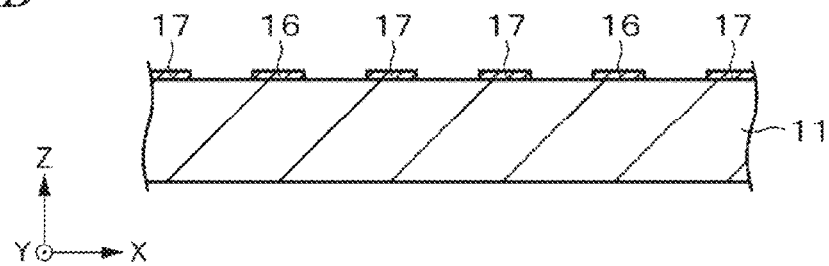

First, as illustrated in FIG. 6A, conductive pastes 16p and 17p are printed on one surface of the base material 11. Next, the base material 11 is conveyed to a heating furnace and made to pass through the heating furnace to dry the conductive pastes 16p and 17p printed on the one surface of the base material 11, and then the base material 11 is sandwiched between rotating heating rollers, and calendering treatment is applied to the dried conductive paste 12p. With this processing, the wiring 16 and wiring 17 having conductivity are formed on the one surface of the substrate 11 as illustrated in FIG. 6B.

Figure 6C:
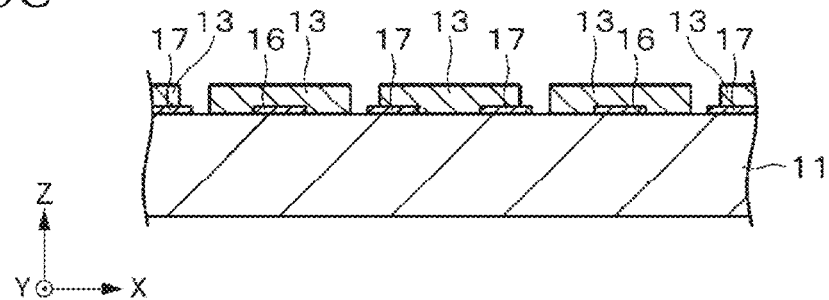
Figure 6D:
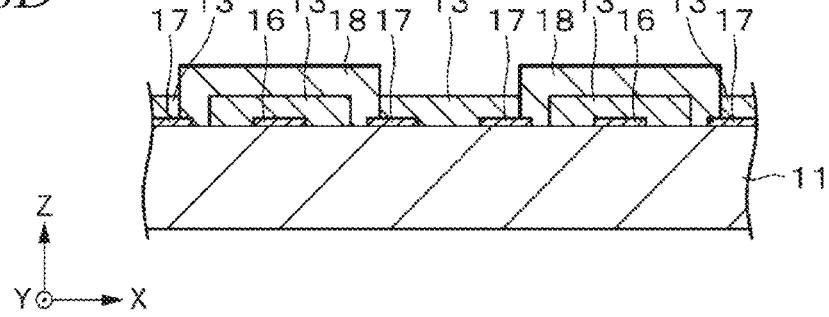

Next, as illustrated in FIG. 6C, a coating material to form an insulation layer is printed on the one surface of the base material 11, and then dried and cured so as to form and expose an opened portion at each of the end portions of the set of wiring 17, 17, thereby forming the insulation layer 13. Next, as illustrated in FIG. 6D, a conductive paste is printed so as to connect adjacent opened portions and then dried and cured, thereby forming the jumper wiring 18. An intended conductive element can be achieved by the above-described processing.

[Effects]

In the manufacturing method for a conductive element according to the third embodiment, the wiring 16 and wiring 17 are formed by performing pressure annealing for the conductive pastes 16p and 17p, and therefore, the wiring 16 and wiring 17 can be made thin and the top portion thereof can be formed flat. Therefore, increase of the thickness of the insulation layer 13 can be suppressed, and the wiring 16 and wiring 17 can be sufficiently covered only by forming the insulation layer 13 having the single layer structure (specifically, the coating material to form the insulation layer is printed only once). On the other hand, according to a general manufacturing method for a conductive element, wiring is formed thick, and irregularities at a top portion thereof become large. Therefore, an insulation layer 13 having a two-layer structure is needed to be formed (specifically, the coating material to form the insulation layer is needed to be printed twice) in order to sufficiently cover the wiring 16 and wiring 17.

4. Fourth Embodiment

As illustrated in FIG. 7A, an input device 40 according to a fourth embodiment of the present technology is provided on a display surface of a display device 30. The display device 30 and the input device 40 are bonded to each other via a bonding layer 31 including, for example, an adhesive. A front panel (not illustrated) as a surface member may be further provided on an input surface of the input device 40.

(Display Unit)

As the display device 30, for example, various kinds of display devices such as a liquid crystal display, an organic or inorganic EL display, a plasma display panel (PDP), a cathode ray tube (CRT) display, and a surface-conduction electron-emitter display (SED) can be used.

(Input Device)

The input device 40 is a so-called projection-type capacitive touch panel. As illustrated in FIG. 7A, the input device 40 includes a first transparent conductive element 40a and a second transparent conductive element 40b provided on the first transparent conductive element 40a. The first transparent conductive element 40a and the second transparent conductive element 40b are bonded to each other via a bonding layer not illustrated. Additionally, a protective layer may be provided on an input surface side of the second transparent conductive element 40b, and a shield layer may be provided on the display device 30 side of the first transparent conductive element 40a, as necessary. Here, two directions having a relation of intersecting orthogonally inside a main surface of the input device 40 are defined as an X-axis direction (first direction) and a Y-axis direction (second direction). Additionally, a direction perpendicular to the main surface of the input device 40 is defined as a Z-axis direction (third direction).

(First and Second Transparent Conductive Elements)

As illustrated in FIGS. 7A and 7B, the first transparent conductive element 40a includes: a base material 41a; a plurality of transparent electrodes 42a and a plurality of sets of wiring 43a which are provided on one surface of the base material 41a; and an insulation layer 44a provided on the one surface of the base material 41 in a manner covering the transparent electrodes 42a and the sets of wiring 43a. As illustrated in FIGS. 7A and 7B, the second transparent conductive element 40b includes: a base material 41b; a plurality of transparent electrodes 42b and a plurality of sets of wiring 43b which are provided on one surface of the base material 41b; and an insulation layer 44b provided on the one surface of the base material 41b in a manner covering the transparent electrodes 42b and the sets of wiring 43b. A flexible printed circuit (FPC) 45 is provided on a periphery of each of the first transparent conductive element 40a and the second transparent conductive element 40b which are bonded to each other.

(Transparent Electrode)

The transparent electrodes 42a are X electrodes extending in the X-axis direction and arranged apart from each other at a predetermined interval in the Y-axis direction. On the other hand, the transparent electrodes 42b are Y electrodes extending in the Y-axis direction and arranged apart from each other at a predetermined interval in the X-axis direction.

As illustrated in FIG. 8A, the transparent electrode 42a includes: a plurality of pad portions (unit electrode bodies) 46a provided at a predetermined interval in the X-axis direction; and a plurality of coupling portions 47a coupling the pad portions 46a adjacent in the X-axis direction. The pad portion 46a and the coupling portion 47a are integrally formed. As illustrated in FIG. 8B, the transparent electrode 42b includes: a plurality of pad portions (unit electrode bodies) 46b provided at a predetermined interval in the Y-axis direction; and a plurality of coupling portions 47b coupling the pad portions 46b adjacent in the Y-axis direction. The pad portion 46b and the coupling portion 47b are integrally formed.

When viewed from the Z-axis direction, the coupling portions 47a and 47b are made to orthogonally intersects with the transparent electrodes 42a and 42b in an overlapping manner, and furthermore, the inside of an XY plane is paved with the pad portions 46a and 46b. As a shape in each of the pad portions 46a and 46b, for example, a polygon such as a rhomboid (diamond shape) or a rectangle, a star shape, a cross shape, a mesh shape, and the like can be used, but not limited to these shapes. FIGS. 7B, 8A, and 8B illustrate the case where each of the pad portions 46a and 46b has a rhomboid shape. Meanwhile, each of the transparent electrodes 42a and 42b may have a linear shape. In this case, the plurality of transparent electrodes 42a, 42b has a stripe shape in which these transparent electrodes orthogonally intersect with each other when viewed from the Z-axis direction.

As a material of the transparent electrodes 42a and 42b, for example, one or more kinds selected from a group including a metal oxide material having electrical conductivity, a metal material, a carbon material, a conductive polymer, and the like can be used. Examples of the metal oxide material can include indium tin oxide (ITO), zinc oxide, indium oxide, antimony added tin oxide, fluorine added tin oxide, aluminum added zinc oxide, gallium added zinc oxide, silicon added zinc oxide, zinc oxide-tin oxide series, indium oxide-tin oxide series, zinc oxide-indium oxide-magnesium oxide series, and the like. As the metal material, for example, metal nano-particles, a metal wire, and the like can be used. Specific examples of these materials can include metal such as copper, silver, gold, platinum, palladium, nickel, tin, cobalt, rhodium, iridium, iron, ruthenium, osmium, manganese, molybdenum, tungsten, niobium, tantelum, titanium, bismuth, antimony, and lead, alloys thereof, and the like. Examples of the carbon material can include carbon black, a carbon fiber, fullerene, graphene, a carbon nanotube, carbon microcoil, nanohorn, and the like. As the conductive polymer, for example, substituted or unsubstituted polyaniline, polypyrrole, polythiophene, (co) polymers including one or two kinds selected from these, and the like can be used.

(Wiring)

The wiring 43a is routed wiring to electrically connect the transparent electrode 42a to the FPC 45, and the wiring 43a is drawn out from one end of the transparent electrode 42a, passed around a peripheral portion of the base material 41a, and connected to the FPC 45. The wiring 43b is routed wiring to electrically connect the transparent electrode 42b to the FPC 45, and the wiring 43b is drawn out from one end of the transparent electrode 42b, passed around a peripheral portion of the base material 41b, and connected to the FPC 45.

5. Fifth Embodiment

An electronic apparatus according to a fifth embodiment of the present technology includes one or both of a conductive element according to the first, second, or third embodiment and an input device according to a fourth embodiment. An exemplary electronic apparatus according to the fifth embodiment will be described below.

An example in which the electronic apparatus is a mobile phone 111 will be described with reference to FIG. 9A. The mobile phone 111 is a so-called smartphone, and includes a housing 112, and a display element with a touch panel 113 and a non-illustrated printed circuit board which are housed in the housing 112. The display element with the touch panel 113 includes, on an input operation surface, an input device according to the fourth embodiment. One or both of the display element included in the display element with the touch panel 113, and the printed circuit board may be the conductive element according to the first, second or third embodiment.

An example in which the electronic apparatus is a tablet computer will be described with reference to FIG. 9B. A tablet computer 121 includes a housing 122, and a display element with a touch panel 123 and a non-illustrated printed circuit board which are included in the housing 122. The display element with the touch panel 123 includes, on an input operation surface, an input device according to the fourth embodiment. One or both of the display element included in the display element with the touch panel 123, and the printed circuit board may be the conductive element according to the first, second or third embodiment.

Figure 10:
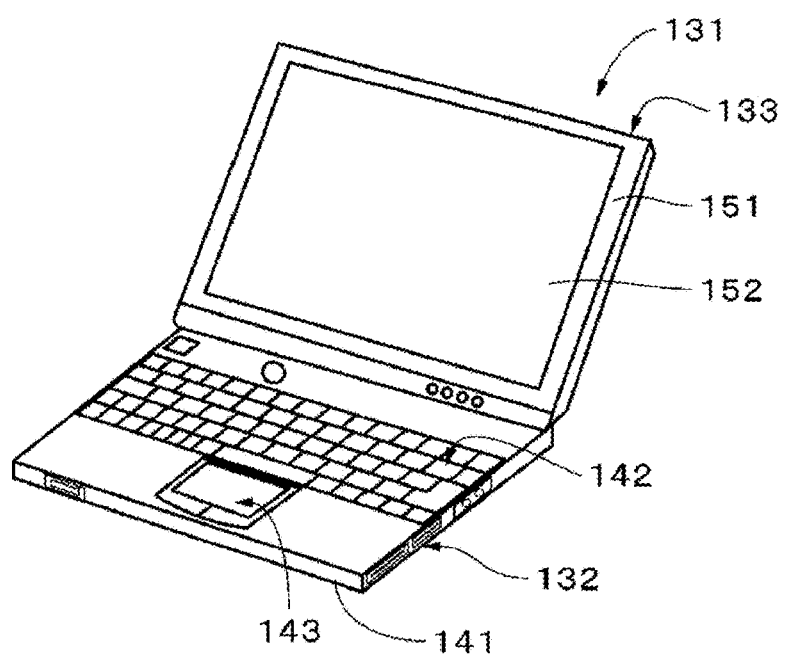
FIG. 10 is a perspective view illustrating a third example of the electronic apparatus according to the fifth embodiment of the present technology.

An example in which the electronic apparatus is a laptop personal computer 131 will be described with reference to FIG. 10. The laptop personal computer 131 includes a computer main body 132 and a display 133. The computer main body 132 includes a housing 141, and a keyboard 142, a touch pad 143, and a non-illustrated printed circuit board which are housed in the housing 141. At least one of the keyboard 142, touch pad 143 and printed circuit board is the conductive element according to the first, second or third embodiment.

The display 133 includes a housing 151 and a display element 152 housed in the housing 151. The display element 152 may be the conductive element according to the first, second or third embodiment. In a case where the display element 152 is a display element with a touch panel, the input device according to the fourth embodiment may be provided on an input operation surface.

6. Sixth Embodiment

Figure 11:
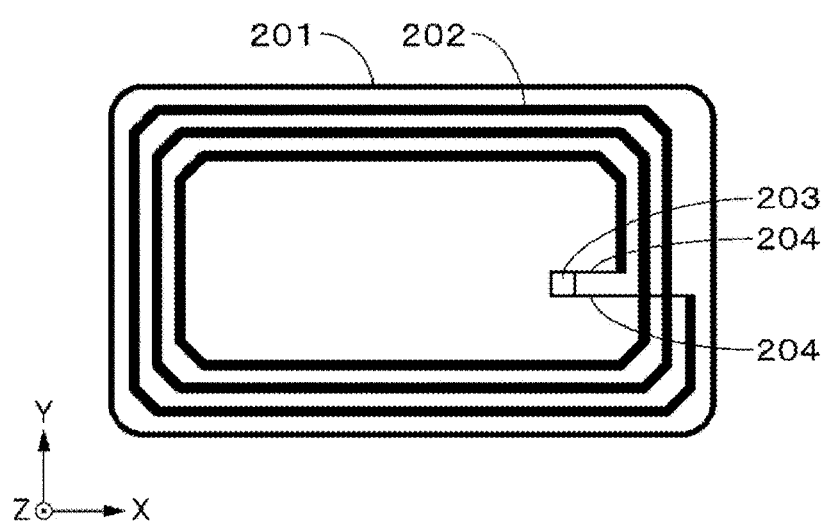
FIG. 11 is a plan view illustrating an exemplary configuration of a conductive element according to a sixth embodiment of the present technology.

As illustrated in FIG. 11, a conductive element according to a sixth embodiment of the present technology is a non-contact type IC card having a communication function to which a radio frequency identification (RFID) technology is applied, and includes a base material 201, and an antenna coil 202, an IC chip 203, and wiring 204 which are provided on one surface of the base material 201, and also includes a non-illustrated insulation layer provided on the one surface of the base material 201 in a manner covering the antenna coil 202, IC chip 203, and wiring 204. Additionally, both surfaces of the IC card are covered with an exterior material not illustrated.

Meanwhile, in the sixth embodiment, the case where the conductive element is an IC card will be described as an example, but the present technology is not limited to the IC card and can be applied to various kinds of conductive elements, communication devices, electronic apparatuses, or the like including an antenna coil for RFID.

As a shape of the base material 201, a film shape, a sheet shape, and a substrate shape can be used, but not particularly limited to these materials, and the shape can be arbitrarily selected and used in accordance with a characteristic required for the IC card. As a material of the base material 201, preferably, a resin material having flexibility is used from the viewpoint of durability, usability, and the like. As such a resin material, for example, polyethylene naphthalate (PEN), polyethylene terephthalate (PET), polyimide (PI), polyester and the like can be used, but not particularly limited to these materials, the resin material can be selected and used from among known resin materials in accordance with a characteristic required for the IC card.

The antenna coil 202 is an electromagnetic induction coil wound around the base material 201 a plurality of times and having a loop coil shape, and both ends thereof is connected to the IC chip 203 via the wiring 204. The antenna coil 202 receives a AC magnetic field emitted from a reader/writer, induces AC voltage, and supplies the AC voltage to the IC chip 203.

The IC chip 203 is driven by electric power supplied from the antenna coil, and controls respective portions inside the IC card. For example, the IC chip 203 communicates with the reader/writer via the antenna coil. Specifically, mutual authentication, data exchange, and the like are performed with the reader/writer.

The antenna coil 202 has a flat portion at a top portion thereof, and includes metal particle powder. An average value of a ratio $R_F$ ($=(F/L) \times 100$ (refer to FIG. 14B)) of a width F of the flat portion included in the top portion of the antenna coil 202 to a width L of the antenna coil 202 is 20% or more, preferably 30% or more, more preferably 40% or more. In a case where the average value of the ratio $R_F$ is less than 20%, it is difficult to reduce surface irregularities of the antenna coil 202, and the surface irregularities of the antenna coil 202 may not be able to be suppressed from protruding from an insulation layer unless otherwise a thickness of the insulation layer provided on the antenna coil 202 is increased.

Arithmetic average roughness Ra of the top portion of the antenna coil 202 is 1 μm or less, preferably 0.6 μm, more preferably 0.2 μm or less. In a case where an average value of the arithmetic average rough Ra exceeds 1 μm, it is difficult to reduce the surface irregularities of the antenna coil 202, and the surface irregularities of the antenna coil 202 may not be able to be suppressed from protruding from the insulation layer unless otherwise the thickness of the insulation layer provided on the antenna coil 202 is increased. The antenna coil 202 has a width of, for example, 500 μm or more and 20 mm or less.

An average value of ten-point average roughness Rz at the top portion of the antenna coil 202 is preferably 5 μm or less, more preferably 4 μm or less, further more preferably 2 μm or less. In a case where the average value of the ten-point average roughness Rz is 5 μm or less, the surface irregularities having large height differences can be reduced, and therefore, the surface irregularities of the antenna coil 202 can be suppressed from protruding from the insulation layer 13 even without increasing the thickness of the insulation layer provided on the antenna coil 202. A material of the antenna coil 202 is similar to a material of wiring 12 in a first embodiment. The antenna coil 202 can be formed in a manner similar to a forming method for the wiring 12 in the first embodiment.

The insulation layer is similar to the insulation layer 13 in the first embodiment. The exterior material constitutes a front surface and a back surface of the IC card and includes, as main components, for example, polymer materials such as polyethylene terephthalate (PET), polybutyl terephthalate (PBT), polyethylene glycol (PEG), and oriented PET, but not particularly limited to these materials, and the material can be arbitrarily selected and used from among known resin materials in accordance with a characteristic required for the IC card.

WORKING EXAMPLES

In the following, the present technology will be specifically described using Working Examples, but the present technology is not limited to these Working Examples.

Figure 12:
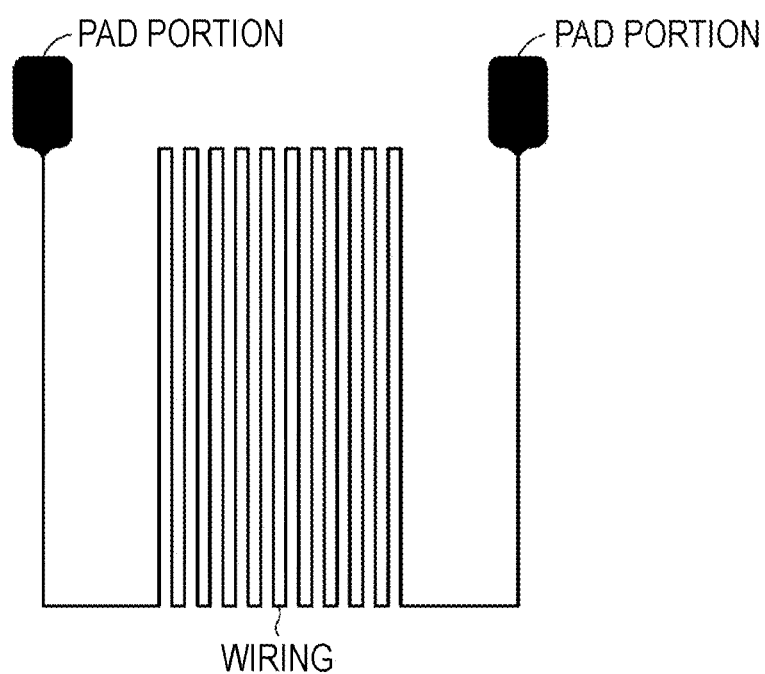
FIG. 12 is a schematic view illustrating a wiring pattern of Working Examples 1 to 5 and Comparative Examples 1 to 3.

In the Working Examples and Comparative Examples described below, a wiring forming device illustrated in FIG. 2 was used to form a wiring pattern. Additionally, the wiring pattern formed by this wiring forming device is illustrated in FIG. 12.

Comparative Example 1

First, as an Ag paste, prepared was a Ag paste for screen printing that is commercially available and has annealing conditions of 120° C. for 30 minutes and paste viscosity of 65000 mPa·sec. Here, the "annealing conditions of 120° C. for 30 minutes" indicates annealing conditions in a case conforming to a wiring forming method of the present Comparative Example 1. Next, the Ag paste was printed by gravure printing on a PET film having a thickness of 50 μm. Next, the PET film was conveyed into a heating furnace having an in-furnace temperature of 120° C., and conveyed through the inside of the heating furnace for 30 minutes. With this processing, the Ag paste was dried and annealed and a wiring film (conductive film) having the wiring pattern illustrated in FIG. 12 was achieved.

(Working Example 1) First, an Ag paste was printed by gravure printing on a PET film having a thickness of 50 μm. Meanwhile, as the Ag paste, the Ag paste similar to that of the Comparative Example 1 was used. Next, this PET film was conveyed into a heating furnace having an in-furnace temperature of 120° C., and conveyed through the inside of the heating furnace for one minute. With this processing, solvent included in the Ag paste was volatilized and the Ag paste was dried. Next, calendering treatment was applied to the PET film in which the Ag paste was dried under calendering treatment conditions specified in Table 1. Note that a surface temperature of a supporting surface side roller was set equal to or less than a surface temperature of a printing surface side roller. With this processing, a wiring film having the wiring pattern illustrated in FIG. 12 was achieved.

(Working Example 2) A wiring film was obtained in a manner similar to the Working Example 1 except that the calendering treatment conditions were changed to those specified in Table 1.

Comparative Example 2

A wiring film was obtained in a manner similar to the Comparative Example 1 except that screen printing was used instead of gravure printing.

(Working Example 3) A wiring film was obtained in a manner similar to the Working Example 1 except that screen printing was used instead of gravure printing.

(Working Example 4) A wiring film was obtained in a manner similar to the Working Example 3 except that the calendering treatment conditions were changed to those specified in Table 1.

Comparative Example 3

First, as a Cu paste, prepared was a Cu paste for screen printing that is commercially available and has annealing conditions of 120° C. for 30 minutes and a paste viscosity of 100000 mPa·sec. Next, a wiring film was achieved in a manner similar to the Comparative Example 2 except that a Cu paste was used instead of the Ag paste.

Working Example 5

A wiring film was obtained in a manner similar to the Working Example 3 except that a Cu paste was used instead of the Ag paste and the calendering treatment conditions were changed to those specified in Table 1. Note that a Cu paste similar to that of the Comparative Example 3 was used as the Cu paste.

[Evaluation]

As for the wiring film achieved as described above, evaluation is made as follows. However, evaluation on peeling of the wiring was performed only for the wiring film achieved by using the calendering treatment.

(Average Values of Arithmetic Average Roughness Ra and Ten-Point Average Roughness Rz)

First, a non-contact surface/layer cross-sectional shape measuring system (trade name: VertScan R5500GL-M100-AC, manufactured by Ryoka Systems Inc.) was used to measure a surface shape in each of five points randomly selected from the surface on a wiring side of the wiring film. Next, arithmetic average roughness Ra and ten-point average roughness Rz are obtained from a cross-sectional profile (refer to FIG. 14A (Working Example 1) and FIG. 15A (Comparative Example 1)) obtained by tracing a center in the width direction of the wiring along an extending direction thereof (refer to a direction of a line (1) illustrated in FIG. 13A (Working Example 1) and FIG. 13B (Comparative Example 1) in each measurement visual field where measurement was performed. Here, the arithmetic average roughness Ra conforms to JIS B 0601, and the ten-point average roughness Rz conforms to JIS'94.

The measurement conditions are stated below.
Measurement magnification: ×100
Visual field size: 469.89×352.55 μm Next, the arithmetic average roughness Ra obtained in each measurement visual field was simply averaged to calculate an average value of the arithmetic average roughness Ra. Additionally, the ten-point average roughness Rz obtained in each measurement visual field was simply averaged to calculate an average value of the ten-point average roughness Rz.

(Average Value of Ratio $R_F$)

First, a surface shape was measured at the five positions randomly selected in a manner similar to a method of obtaining "an average value of the arithmetic average roughness Ra and an average value of the ten-point average roughness Rz". Next, the ratio $R_F$ (=(F/L)×100) [%] of the width F of the flat portion at the top portion of the wiring to the width L of the wiring was obtained in each measurement visual field where measurement was performed. Next, the ratio $R_F$ obtained in each measurement visual fields is simply averaged to calculate an average value of the ratio $R_F$.

Note that the ratio $R_F$ in each measurement visual field was obtained as follows. First, a highest position of the top portion of the wiring was obtained, and a cross-sectional profile (refer to FIG. 14B (Working Example 1) and FIG. 15B (Comparative Example 1)) was obtained by tracing the wiring in the width direction of the wiring (refer to a direction of a line (2) illustrated in FIG. 13A (Working Example 1) and FIG. 13B (Comparative Example 1)) in a manner including the highest position. Here, the highest position is a position obtained while setting a surface of the PET film as a reference. Next, the ratio $R_F$ (=(F/L)×100) [%] of the width F of the flat portion at the top portion of the wiring to the width L of the wiring was obtained from the obtained cross-sectional profile. Here, as illustrated in FIGS. 14B and 15B, the width F of the flat portion indicates a distance from the highest position of the wiring out of the top portion of the wiring to a position having a height lower by 0.5 µm in the width direction of the wiring in the visual field.

(Average Value and Dispersion of Maximum Height $H_{max}$ of Wiring)

First, a surface shape was measured at the five positions randomly selected in a manner similar to the method of obtaining "an average value of the arithmetic average roughness Ra and an average value of the ten-point average roughness Rz". Next, the maximum height $H_{max}$ in the top portion of the wiring was obtained in each measurement visual field where measurement was performed. Next, an average value of the maximum height $H_{max}$ was obtained by simply averaging the maximum heights $H_{max}$ obtained at the five positions. Additionally, dispersion from the average value of the maximum height $H_{max}$ was obtained by using the maximum heights $H_{max}$ obtained at the five positions.

(Peeling of Wiring)

The wiring film was visually observed and confirmed whether no peeling is caused in the wiring.

(Resistance Value of Wiring)

A resistance value is measured by pressing a tester rod of a digital multimeter (trade name: PC720M, manufactured by Sanwa Electric Instrument Co., Ltd.) against a pad portion of the wiring film (refer to FIG. 12).

Table 1 specifies manufacturing conditions and evaluation results of the wiring films of Working Examples 1 to 5 and Comparative Examples 1 to 3.

TABLE 1

| | KIND OF PASTE | PRINTING METHOD | CONDITIONS OF CALENDERING TREATMENT | PEELING OF WIRING | RESISTANCE VALUE [Ω/mm] | $Ra_{ave}$ (5 VISUAL FIELD) [µm] |
|---|---|---|---|---|---|---|
| WORKING EXAMPLE 1 | Ag | GRAVURE PRINTING | PRINTING SURFACE SIDE ROLLER TEMPERATURE = 100° C. PRESSURE = 120 kg/cm | NONE | 0.83 | 0.14 |
| WORKING EXAMPLE 2 | | | PRINTING SURFACE SIDE ROLLER TEMPERATURE = 130° C. PRESSURE = 300 kg/cm | NONE | 0.80 | 0.48 |
| COMPARATIVE EXAMPLE 1 | | | — | — | 0.88 | 1.36 |
| WORKING EXAMPLE 3 | Ag | SCREEN PRINTING | PRINTING SURFACE SIDE ROLLER TEMPERATURE = 100° C. PRESSURE = 120 kg/cm | NONE | 0.47 | 0.26 |
| WORKING EXAMPLE 4 | | | PRINTING SURFACE SIDE ROLLER TEMPERATURE = 130° C. PRESSURE = 300 kg/cm | NONE | 0.35 | 0.31 |
| COMPARATIVE EXAMPLE 2 | | | — | — | 0.46 | 1.53 |
| WORKING EXAMPLE 5 | Cu | SCREEN PRINTING | PRINTING SURFACE SIDE ROLLER TEMPERATURE = 80° C. PRESSURE 120 kg/cm | NONE | 9.59 | 0.66 |
| COMPARATIVE EXAMPLE 3 | | | — | — | 0.68 | 1.43 |

| | $Rz_{ave}$ (5 VISUAL FIELDS) [µm] | $H_{ave}$ (5 VISUAL FIELDS) [µm] | $H_{max}$ DISPERSION [µm] | $R_{F ave}$ (5 VISUAL FIELDS) [%] | $Rz_{ave} + H_{ave}$ [µm] | $Rz_{ave} + H_{ave} + 10$ [µm] |
|---|---|---|---|---|---|---|
| WORKING EXAMPLE 1 | 0.49 | 5.12 | 0.29 | 44 | 5.61 | 15.61 |
| WORKING EXAMPLE 2 | 2.05 | 5.57 | 0.28 | 22 | 7.62 | 17.62 |
| COMPARATIVE EXAMPLE 1 | 5.21 | 7.78 | 0.74 | 6 | 12.99 | 22.99 |
| WORKING EXAMPLE 3 | 1.07 | 9.14 | 0.32 | 29 | 10.21 | 20.21 |
| WORKING EXAMPLE 4 | 1.81 | 8.71 | 0.17 | 26 | 10.52 | 20.52 |
| COMPARATIVE EXAMPLE 2 | 6.72 | 11.51 | 0.63 | 7 | 18.23 | 28.23 |
| WORKING EXAMPLE 5 | 4.55 | 11.41 | 0.26 | 22 | 15.96 | 25.96 |
| COMPARATIVE EXAMPLE 3 | 8.84 | 11.55 | 0.45 | 5 | 20.39 | 30.39 |

However, symbols $Ra_{ave}$, $Rz_{ave}$, $H_{max}$, $H_{ave}$, $R_{Fave}$, and roller temperature in Table 1 represent the following matters.

$Ra_{ave}$: average value of arithmetic average roughness Ra at top portion of wiring [μm]

$Rz_{ave}$: average value of ten-point average roughness Rz at top portion of wiring [μm]

$R_{Fave}$: average value of ratio $R_F$ of width F of flat portion at top portion of wiring to width L of wiring [%]

$H_{max}$: maximum height in top portion of wiring [μm]

$H_{ave}$: average value of maximum height $H_{max}$ in top portion of wiring [μm]

Note that the "roller temperature" represents a temperature of a roller surface. Additionally, "Rz, +$H_{ave}$" represents a lower limit value of a preferable thickness of the insulation layer, and "$Rz_{ave}$+$H_{ave}$+10" represents a lower limit value of a more preferable thickness of the insulation layer. Note that the reason why these lower limit values are preferable is as described above.

The following points can be grasped from Table 1.

In a wiring film obtained by pressure annealing treatment (calendering treatment) using heating rollers (hereinafter referred to as "pressurized and annealed film"), achieved is the wiring in which the average value of the ratio $R_F$ of the width F of the flat portion at the top portion of the wiring to the width L of the wiring is 20% or more, the average value of the arithmetic average roughness Ra at the top portion of the wiring is 1 μm or less, and the average value of the ten-point average roughness Rz at the top portion of the wiring is 5 μm or less. On the other hand, in the wiring film obtained by the annealing treatment using a heating furnace (hereinafter referred to as "annealed film"), achieved is only the wiring in which the average value of the ratio $R_F$ of the width F of the flat portion at top portion of the wiring to the width L of the wiring is less than 20%, the average value of the arithmetic average roughness Ra of the wiring top portion exceeds 1 μm, and the average value of the ten-point average roughness Rz at the top portion of the wiring exceeds 5 μm.

In a case where the printing conditions are similar, the average value of the maximum height $H_{max}$ of the wiring in the pressurized and annealed film is lower than the average value of the maximum height $H_{max}$ of the wiring in the annealed film.

Regardless of the printing conditions, dispersion of maximum height $H_{max}$ of the wiring in the pressurized and annealed film is more reduced than dispersion of the maximum height $H_{max}$ of the wiring in the annealed film. Specifically, the dispersion of the maximum height $H_{max}$ of the wiring in the pressurized and annealed film is reduced to 0.4 μm or less, whereas the dispersion of the maximum height $H_{max}$ of the wiring in the annealed film exceeds 0.4 μm.

In the pressurized and annealed film, low resistance almost equal to that of the annealed film or low resistance close thereto is achieved. Specifically, the low resistance of 10 Ω/mm or less is achieved in the pressurized and annealed film.

In the manufacturing method for the wiring film using the pressure annealing treatment by the heating rollers, the wiring having the low resistance can be formed in a heating time shorter than in the manufacturing method for the wiring film using the annealing treatment by the heating furnace. Therefore, efficiency of manufacturing the wiring film can be improved.

While the embodiments of the present technology have been specifically described above, the present technology is not limited to the above-described embodiments, and various kinds of modifications can be made based on the technical idea of the present technology.

For example, the configurations, methods, processes, shapes, materials, values, and the like exemplified in the above-described embodiments are merely examples, and a configuration, a method, a process, a shape, a material, a value, and the like different therefrom may also be used as necessary.

Additionally, the configurations, methods, processes, shapes, materials, numerical values, and the like exemplified in the above-described embodiments can be mutually combined without departing from the spirit of the present technology.

Additionally, the present technology can adopt configurations below.

(1)

A conductive element including wiring having a flat portion at a top portion and including metal particles, in which an average value of a ratio of a width of the flat portion to a width of the wiring is 20% or more, and an average value of arithmetic average roughness of the top portion is, 1 μm or less.

(2)

The conductive element recited in (1), in which resistance of the wiring is 10 Ω/mm or less.

(3)

The conductive element recited in (1) or (2), in which an average value of ten-point average roughness of the top portion is 5 μm or less.

(4)

The conductive element recited in any one of (1) to (3), in which the wiring is provided on both surfaces.

(5)

The conductive element recited in any one of (1) to (4), in which the wiring includes jumper wiring.

(6)

A conductive element recited in any one of (1) to (5), further including an electrode connected to the wiring.

(7)

The conductive element recited in any one of (1) to (6), further including an insulation layer provided on the wiring.

(8)

The conductive element recited in any one of (1) to (7), further including a base material having flexibility.

(9)

A conductive element including an antenna having a flat portion at a top portion and including metal particles, in which an average value of a ratio of a width of the flat portion to a width of the antenna is 20% or more, and an average value of arithmetic average roughness at the top portion is, 1 μm or less.

(10)

A manufacturing method for a conductive element, including:

printing a conductive paste including metal particles or conductive ink; and pressurizing and simultaneously annealing the printed conductive paste or the printed conductive ink to form wiring having a flat portion at a top portion, in which an average value of a ratio of a width of the flat portion to a width of the wiring is 20% or more, and an average value of arithmetic average roughness of the top portion is 1 μm or less.

(11)

An input device including a conductive element recited in any one of (1) to (9).

(12)

An electronic apparatus including a conductive element recited in any one of (1) to (9).

REFERENCE SIGNS LIST

11 Base material
12, 14, 16, 17, 43a, 43b Wiring
12p, 14p Conductive paste
13, 15 Insulation layer
18 Jumper wiring
40 Input device
40a First conductive element
40b Second conductive element
42a, 42b Transparent electrode (electrode)
111 Mobile phone (electronic apparatus)
121 Tablet computer (electronic apparatus)
131 Laptop personal computer (electronic apparatus)
202 Antenna coil (antenna)

The invention claimed is:

1. A conductive element comprising wiring including metal particles, the wiring having an upper portion and a lower portion, wherein:
   the upper portion of the wiring has a flat top portion,
   an average value of a ratio of a width of the flat top portion of the wiring to a width of the lower portion of the wiring is 20% or more, and
   an average value of an arithmetic average roughness of the upper portion of the wiring is 1 μm or less.

2. The conductive element according to claim 1, wherein a resistance of the wiring is 10 Ω/mm or less.

3. The conductive element according to claim 1, wherein an average value of a ten-point average roughness of the upper portion of the wiring is 5 μm or less.

4. The conductive element according to claim 1, wherein the wiring is provided on first and second surfaces of a base layer, the first and second surfaces being on opposite sides of the base layer.

5. The conductive element according to claim 1, wherein the wiring includes jumper wiring.

6. The conductive element according to claim 1, further comprising an electrode connected to the wiring.

7. The conductive element according to claim 1, further comprising an insulation layer provided on the wiring.

8. The conductive element according to claim 1, further comprising a base layer on which the wiring is disposed, the base layer being formed of a material having flexibility.

9. The conductive element according to claim 1, wherein the conductive element is incorporated in an input device.

10. The conductive element according to claim 1, wherein the conductive element is incorporated in an electronic apparatus.

11. A conductive element comprising an antenna including metal particles, the antenna having an upper portion and a lower portion, wherein:
    the upper portion of the antenna has a flat top portion,
    an average value of a ratio of a width of the flat top portion of the antenna to a width of the lower portion of the antenna is 20% or more, and
    an average value of an arithmetic average roughness at the upper portion of the antenna is 1 μm or less.

12. A manufacturing method for a conductive element, the method comprising:
    printing a conductive paste including metal particles or conductive ink to form printed conductive paste or printed conductive ink; and
    pressurizing and simultaneously annealing the printed conductive paste or the printed conductive ink to form wiring having an upper portion and a lower portion, wherein:
    the upper portion of the wiring has a flat top portion,
    an average value of a ratio of a width of the flat top portion of the wiring to a width of the lower portion of the wiring is 20% or more, and
    an average value of an arithmetic average roughness of the upper portion of the wiring is 1 μm or less.

* * * * *